(12) United States Patent
Sato et al.

(10) Patent No.: US 7,843,198 B2
(45) Date of Patent: Nov. 30, 2010

(54) ELECTRICAL CONNECTING APPARATUS

(75) Inventors: Hitoshi Sato, Aomori (JP); Kiyotoshi Miura, Aomori (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 477 days.

(21) Appl. No.: 11/995,459

(22) PCT Filed: Aug. 2, 2005

(86) PCT No.: PCT/JP2005/014487

§ 371 (c)(1),
(2), (4) Date: Jan. 11, 2008

(87) PCT Pub. No.: WO2007/015314

PCT Pub. Date: Feb. 8, 2007

(65) Prior Publication Data
US 2010/0134121 A1    Jun. 3, 2010

(51) Int. Cl.
G01R 31/04    (2006.01)
G01R 31/02    (2006.01)
(52) U.S. Cl. .................................... 324/538; 324/755
(58) Field of Classification Search ................ 324/538, 324/537, 500, 758, 757, 754, 755, 765, 555
See application file for complete search history.

(56) References Cited

U.S. PATENT DOCUMENTS

| | | | |
|---|---|---|---|
| 6,359,452 B1* | 3/2002 | Mozzetta | 324/754 |
| 6,541,991 B1* | 4/2003 | Hornchek et al. | 324/755 |
| 6,747,447 B2* | 6/2004 | Markert et al. | 324/158.1 |
| 7,385,408 B1* | 6/2008 | Adney et al. | 324/755 |
| 7,394,265 B2* | 7/2008 | Kojima | 324/754 |
| 7,629,804 B2* | 12/2009 | Nguyen et al. | 324/758 |

FOREIGN PATENT DOCUMENTS

| | | |
|---|---|---|
| JP | 10-260233 A | 9/1998 |
| JP | 2003-035725 A | 2/2003 |
| WO | WO 01/71779 | 9/2001 |
| WO | WO 03/062837 A1 | 7/2003 |
| WO | WO 2006/126279 A1 | 11/2006 |

OTHER PUBLICATIONS

Pat. Abstract of JP (JP 10-260233 A), Sep. 29, 1998, Micronics Japan Co. LTD.
Pat. Abstract of JP (JP 2003-035735 A), Feb. 7, 2003, Micronics Japan Co. LTD.

* cited by examiner

*Primary Examiner*—Hoai-An D Nguyen
(74) *Attorney, Agent, or Firm*—Ingrassia Fisher & Lorenz, P.C.

(57) ABSTRACT

An electrical connecting apparatus for use in an electrical inspection of a tester and a device under test. The electrical connecting apparatus is provided with a probe assembly to be tightened by tightening screw members toward the support member and having a wiring board interposed between itself and a support member. In order to prevent deformation of the probe board of the probe assembly due to tightening of the screw members, a spacer disposed to penetrate the wiring board is between the support member and probe board and penetrated by the screw members. Both end faces of the spacer are convex spherical surface.

12 Claims, 9 Drawing Sheets

US 7,843,198 B2

ELECTRICAL CONNECTING APPARATUS

TECHNICAL FIELD

The present invention relates to an electrical connecting apparatus such as a probe card for use in connection between a device under test such as an electric circuit of an integrated circuit and an electric circuit of a tester for conducting an electrical test of the device under test.

BACKGROUND

As one of electrical connecting apparatus of this type, there is provided an electrical connecting apparatus comprising a probe board and a plurality of probes extended from the probe board and capable of adjusting the flatness of the probe board (see Patent Document 1). According to this conventional electrical connecting apparatus, it is possible to apply pressing force or tensile force from a support member supporting the probe board to a part of the probe board. By adjusting this action force, even if bending is caused in the probe board of a probe assembly, the flatness of the probe board can be maintained by correcting the curved deformation of the probe board, thereby enabling to align the tips of the probes.

However, according to the aforementioned prior art described in Patent Document 1, it is necessary to adjust so that all the probe tips may be positioned on the same plane according to curved deformation introduced to each probe board every time the probe card assembly is assembled into the electrical connecting apparatus. The operation to adjust so that all the probe tips are adequately contact each of corresponding electrical connection terminals of the device under test is complicated and needs skill. Particularly, in an investigation of multiple integrated circuits formed on a semiconductor wafer, the number of probes of the probe assembly is remarkably increased, so that an operation to adjust to have such multiple probes adequately contact respective corresponding pads on the semiconductor wafer is not easy. Furthermore, such an adjusting operation is necessitated every time the probe assembly is replaced.

The inventors in this Application, therefore, proposed in the earlier International Patent Application (PCT/JP2005/009812) an electrical connecting apparatus which, in spite of a deformation of a probe board, dispenses with a flattening and adjusting operation of the probe board after assembling a probe assembly into an electrical connecting apparatus and which is capable of obtaining reliable electrical connection between the probes and corresponding electrical connecting terminals of an electric circuit of a device under test.

In the probe assembly of this electrical connecting apparatus, probes are formed on the probe board having a curved deformation in an unloaded free state so as to have the tips align on the same plane. By tightening a mounting bolt which penetrates a wiring board disposed between a support member and the probe board, the probe board is combined with the support member. Between a reference plane of the probe board and the support member, a cylindrical spacer is inserted, penetrating the wiring board disposed therebetween. This spacer acts to retain the deformation of the probe board at the time of tightening the mounting bolt. Thus, since the probe board is attached to the reference plane of the support member with the deformation kept as it is, all the probe tips are positioned on the same plane.

Consequently, after the probe assembly is attached to the support member, all the probe tips can be pressed substantially uniformly against each electrical connection terminal of the electric circuit which is a device under test. Thus, every time the probe assembly is replaced, too, the above-mentioned complicated flattening adjusting operation such as the conventional one can be dispensed with, thereby enabling to carry out an efficient electrical test.

In a spacer of this type, however, if both end faces are flat planes orthogonal to the axis of the spacer and an inclination is caused on the reference plane of the support member due to deflection or distortion of, e.g., the support member receiving the end faces, an end face of the spacer and the contact face of the support member for receiving the end face do not abut uniformly in the peripheral direction of the spacer, so that the contacting relation between both becomes unstable. Also, if an inclination is caused by a production error in a through hole, which permits the spacer to penetrate therethrough, formed on the wiring board to be inserted between the probe board and the support member, the contact relationship between the support member receiving the end face and the contact face of the support member which receives the end face or the contact face of the probe board becomes likewise unstable.

If the contact relationship between the end face of the spacer and the support member receiving the end face or the contact face of the probe board is unstable, slackness in tightening of the bolt supporting the probe board on the support member might be caused due to a lingered strong vibration, resulting in degradation in durability.

Patent Document 1: National Public Disclosure No. 2003-528459

DISCLOSURE OF THE INVENTION

Problem to Be Solved

An object of the present invention is to provide an electrical connecting apparatus excellent in durability by surely supporting a probe board on a support member without spoiling the function of a spacer for holding the probe board on the support member.

Means to Solve Problem

The electrical connecting apparatus according to the present invention is an electrical connecting apparatus which connects a tester and an electrical connection terminal of a device under test to undergo an electrical inspection by the tester, comprising: a support member having a mounting reference plane; a wiring board having a wiring circuit to be connected to the tester and disposed with one surface opposed to the reference plane of the support member and having a plurality of through holes penetrating in a plate thickness direction; a flat plate-like probe board on one side of which are formed a plurality of probes capable of making their tip portions abut on connection terminals of the device under test and on the other side of which a plurality of threaded holes are formed in correspondence to the through holes of the wiring board, the other side being disposed to oppose the other side of the wiring board; an electrical connector disposed between the probe board and the wiring board to electrically connect the probes at corresponding parts of the wiring circuit; screw members which penetrate at least the through holes of the wiring board so as to combine the probe board with the support member and whose front ends are screwed into the threaded holes; and a plurality of cylindrical spacers arranged, penetrating at least the wiring board between the other side of the probe board and the reference plane of the support member and penetrated respectively by the screw members, and is characterized in that one end face of the spacer and at least one of the support member receiving the end face and the contact plane of the probe board is a spherical curved surface.

In the electrical connecting apparatus according to the present invention, the spacer to be disposed, penetrating the through hole of the wiring board between the support member and the probe board, has its one end abut the reference plane of the support member and the other end abut the support member receiving the end face. At least one of the one end face of the spacer and the support member receiving the end face or the contact face of the probe board is a spherical curved surface.

For instance, even if inclination is caused in the reference plane of the support member due to deflection or distortion of the support member, it is possible to retain a stable contact state between the flat end faces by forming one end abutting the reference plane of the spacer as a spherical surface, in comparison to a state where the flat end faces abut each other angularly. Also, for instance, even if the through hole to receive the spacer is out of a regular position and formed a little inclined thereby causing an error in an orthogonal relation between the axis of the spacer to be guided into the through hole and the contact plane receiving the end face of the spacer, a more stable contact state of one spherical curved surface of the contact plane with the other, e.g., flat plane, can be retained than where both flat end faces contact angularly.

Therefore, by forming either the one end face of the spacer or the contact face to receive the end face as a spherical curved surface, a stable contact state of both faces can be retained, so that even if an outer force such as vibration acts on the screw member or the spacer, tightening of the screw member is not loosened, and the probe board can be surely supported on the support member.

A probe board with a curved deformation in an unloaded free state can be used for the above-mentioned probe board. In such a case, the probes is formed with their tips positioned on the same plane such that the probe board retains the deformation. Also, the spacer serves to retain the curved deformation of the probe board, so that, without adjusting the curved deformation of the probe board, the tips of the probes can be retained on the same plane. In such a probe board, the spacer capable of holding a stable contact state as mentioned above is especially useful for surely retaining the predetermined deformation and aligning the tips of the probes on the same plane.

It is possible to form, on the other side of the probe board having a curved deformation causes, a plurality of anchor portions having the threaded holes which receive the front ends of the screw members respectively, and the top surfaces of the anchor portion can be made flat planes positioned on the same plane with the deformation of the probe board retained as it is. This makes it possible to use the spacers of the same length in spite of the curved deformation of the probe board in order to align the tips of the probes on the same plane.

The end face abutting the top surface of the anchor portion of the spacer can be made a convex spherical surface.

Also, the end face abutting the reference plane of the support member of the spacer can be formed as a spherical surface.

Otherwise, both of the end face abutting the top surface of the anchor portion of the spacer and the end face abutting the reference plane of the support member of the spacer can be made convex spherical surfaces.

It is possible to dispose a washer permitting the screw member to penetrate between the spacer and the top surface of the anchor portion receiving one end surface of the spacer. One surface opposing the top surface of the anchor portion of the washer can be made a flat plane, and the other surface receiving the end face of the spacer can be made a spherical surface.

When the above-mentioned washer is used, the one end face of the spacer can be made a convex spherical surface, while the other surface of the washer which receives the one end face can be made a concave spherical surface.

Also, when the above-mentioned washer is used, the end face of the spacer opposing the reference plane of the support member can be made a flat plane.

Further, when the above-mentioned washer is used, the end face of the spacer opposing the reference plane of the support member can be made a convex spherical surface.

It is possible to dispose between the spacer and the top surface of the anchor portion receiving one end face of the spacer a washer permitting the screw member to penetrate a spherical body and to use the spherical body in which a through hole permitting the screw member to penetrate in the diametrical direction can be used as the washer.

The probe board can be constituted by a ceramic plate and a multilayer interconnection board formed on one surface of the ceramic plate. It is possible to form on the multilayer interconnection board a plurality of probe lands for the probes to project from the ceramic plate so as to be away in a direction to be away from the ceramic plate. Also, each of the probes is extended from the projecting end face of each probe land. The end face of the probe land is located on the same plane with its deformation retained. This constitution enables, even if a curved deformation occurs to the ceramic plate, to align the tips on the same plane with the curved deformation retained.

EFFECT OF THE INVENTION

According to the electrical connecting apparatus of the present invention, the spacer for holding the probe board on the support member can be stably disposed, so that the looseness due to vibration can be prevented, and the probe board can be surely supported on the support member, thereby improving the durability.

Figure 1:
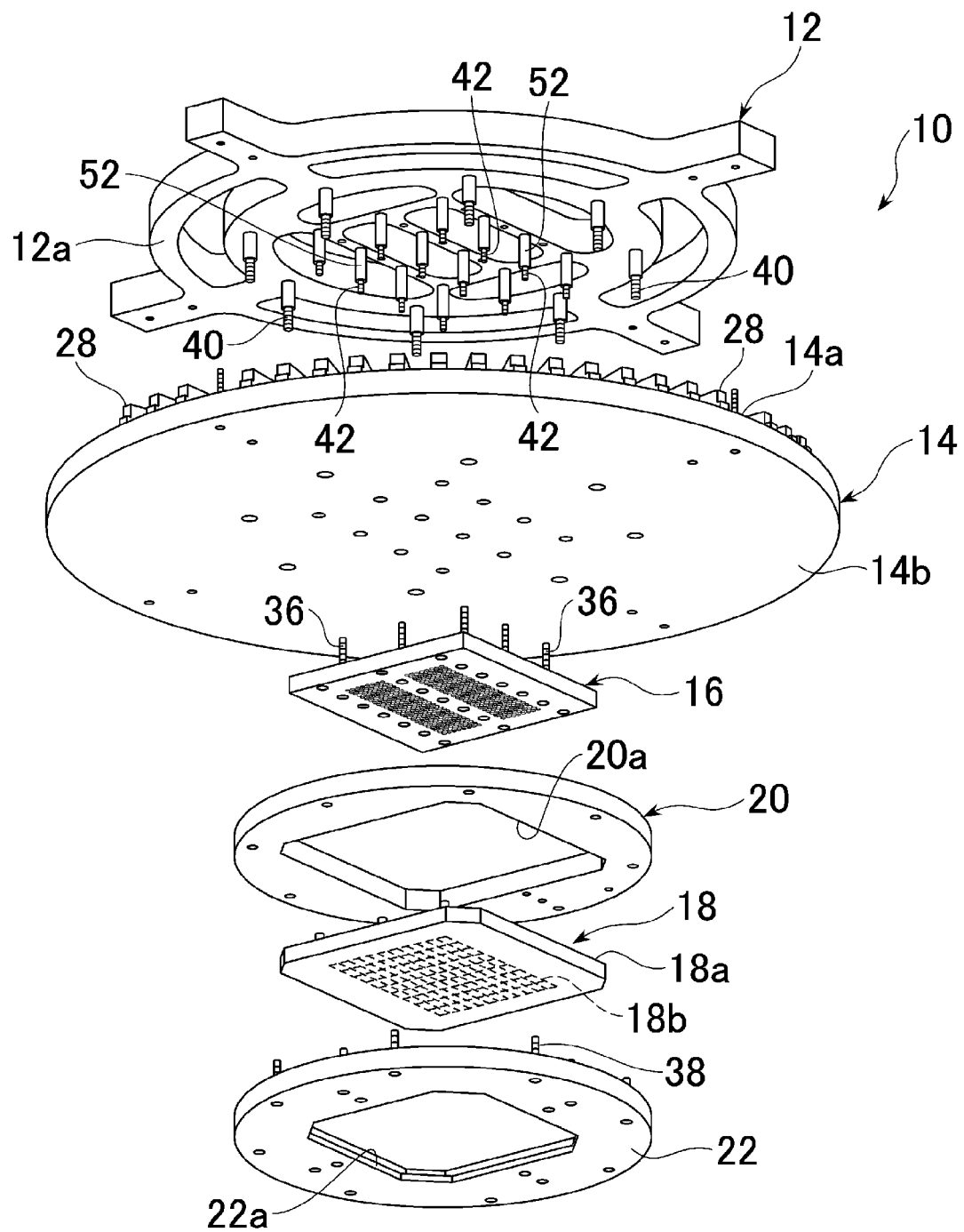
FIG. 1 is an exploded perspective view showing one embodiment of the electrical connecting apparatus according to the present invention.

EXPLANATION OF REFERENCE NUMERALS 10 electrical connecting apparatus
12 support member
14 wiring board
16 electric connector
18 probe assembly
18a probe board
18b probe
24 device under test (semiconductor wafer)
26 tester
34 probe land
48 female threaded hole
50 anchor portion
52, 72 spacer
54 through hole
58, 78 washer

BEST MODE TO CARRY OUT THE INVENTION

The electrical connecting apparatus 10 according to the present invention is shown in FIG. 1 in an exploded state. This electrical connecting apparatus 10 comprises: a flat plate-like support member 12 whose underside 12a is a flat mounting reference plane; a circular flat plate-like wiring board 14 to be held on the mounting surface 12a of the support member; a probe assembly 18 to be electrically connected to the wiring board 14 via an electric connector 16; a base ring 20 with a central opening 20a for receiving the electric connector 16 formed; and a fixed ring 22 for sandwiching the edge portion of the probe assembly 18 together with the edge portion of the central opening 20a of the base ring. This fixed ring 22 has in its central portion a central opening 22a for permitting exposure of probes 18b mentioned later of the probe assembly 18.

Figure 2:
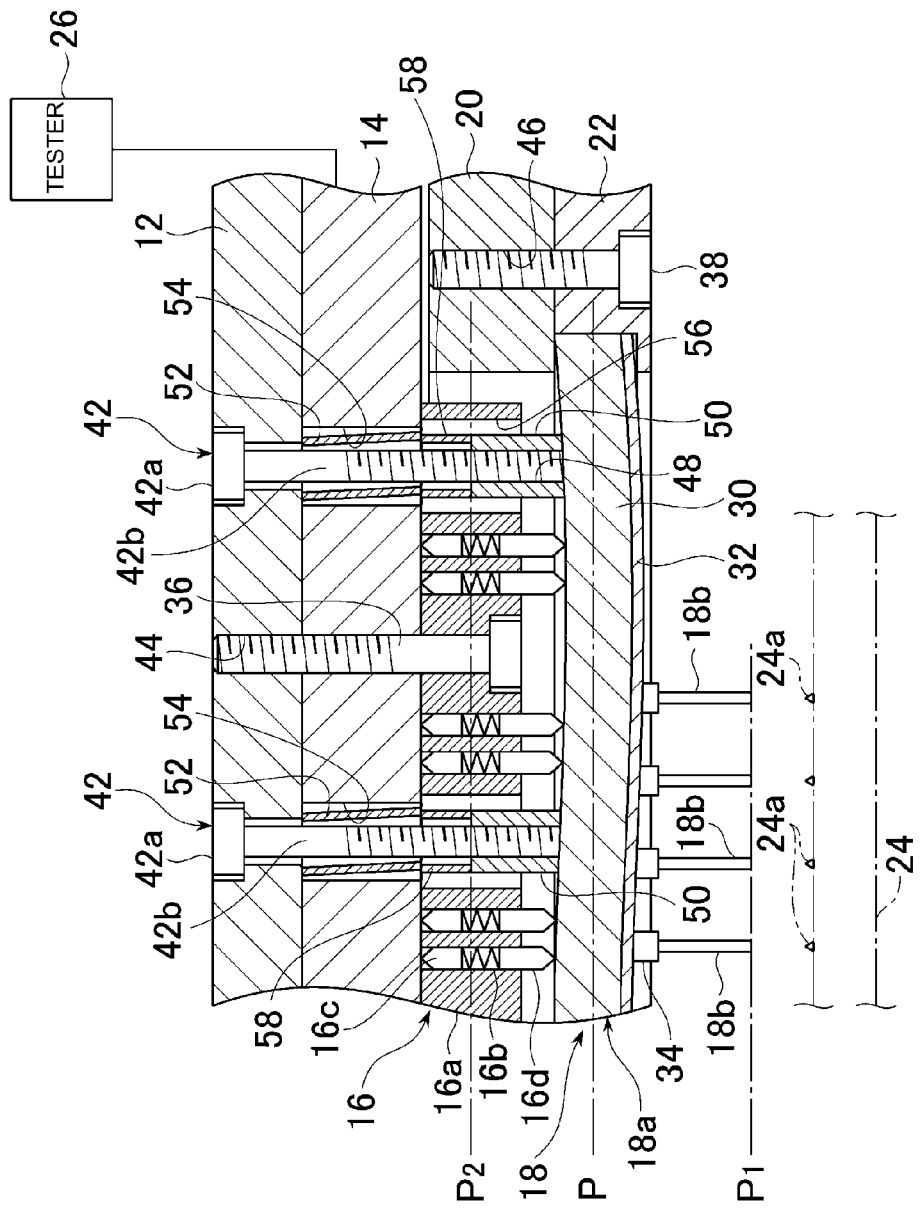
FIG. 2 is a sectional view of the electrical connecting apparatus shown in FIG. 1.

These members 12-22 are, as shown in FIG. 2, integrally assembled and used for connecting each connection pad 24a which is a connection terminal of an IC circuit to an electric circuit (not shown) of a tester 26 for an electrical inspection of a plurality of the IC circuits (not shown) incorporated into a semiconductor wafer 24, for example.

As shown in FIG. 1, the wiring board 14 is made, for example, of a generally circular plate-like polyimide resin plate, and at an annular peripheral portion of its upside 14a are arranged a plurality of connectors 28 to be connected to the electric circuit of the tester 26 in an annular alignment. In the central portion of the underside 14b of the wiring board 14 are arranged a plurality of connection terminals (not shown) corresponding to the connectors 28 in a rectangular matrix state and each connector 28 and each connection terminal of the wiring board 14 are connected to each other via a heretofore well known wiring circuit not shown formed within the polyimide resin plate.

The support member 12 is a frame member made, for example, of a stainless steel plate permitting exposure of these connectors 28, and its underside 12a is disposed in contact with the upside 14a of the wiring board 14.

As shown in FIG. 2, the probe 18 is basically provided with the probe board 18a, and a plurality of probes 18b formed on the underside of the probe board. The probe board 18a is, as is heretofore well known, provided with a base plate member 30 made, for example, of a ceramic plate, and a multilayer interconnection board 32 formed on the underside of the base plate member, i.e., ceramic plate.

On the ceramic plate 30 are formed electrically conducting paths (not shown) to be connected to the corresponding connection terminals of the wiring board 14 through the electric connector 16. As is heretofore well known, there are probe lands 34 connected to the corresponding electrically conducting paths of the corresponding electrically conducting paths of the ceramic plate 30 through the wiring path of the multilayer interconnection board, and the probe 18b is adhered to each probe land 34.

The electric connector 16 is, in the illustration, a pogo pin type electric connector, in which each pair of pogo pins 16c, 16d connect the connection terminals of the wiring board 14 and the corresponding electrically conducting path of the ceramic plate 30 through an electrically conducting compression coil spring 16b received within a pogo pin block 16a made of an electrically insulating plate member. Each probe 18b of the probe assembly 18 is connected to the corresponding connector 28 via the electric connector 16.

Therefore, when the tip of the probe 18b is brought into contact with a connection pad 24a of the semiconductor wafer 24 which is a device under test, the connection pad is connected to the tester 26 via the corresponding connector 28, so that an electrical inspection of the electric circuit of the semiconductor wafer 24 can be conducted by the tester.

The foregoing electrical connecting apparatus 10 is assembled by bolts 36-42 including a plurality of male screw members. In other words, as shown in FIG. 2, an electric connector 16 is mounted on this support member 12 by the bolt 36 disposed to penetrate the wiring board 14. The bolt 36 sandwiches the wiring board 14 between the pogo pin block 16a of the electric connector 16 and the support member 12 by screwing its front end into a female threaded hole 44 formed on the support member 12.

Also, the base ring 20 and the fixed ring 22 are combined by the bolt 38 whose front end is screwed into the female threaded hole 46 formed in the base ring 20 so as to sandwich the edge portion of the probe board 18a of the probe assembly 18. This base ring 20 penetrates the support member 12 and the wiring board 14 to be fixed on the support member 12 by a bolt 40 (see FIG. 1) whose front end is screwed into the base ring 20.

As mentioned above, the edge portion of the probe board 18a of the probe assembly 18 is sandwiched between the base ring 20 and the fixed ring 22. When the electrical conducting path is formed on the ceramic plate 30 as a board member of the probe board 18a whose edge portion is sandwiched, or when the multilayer interconnection board 32 is formed, a wave-like curved deformation, for example, sometimes occurs to the flat ceramic plate 30 by heat and exterior force in its production process. Or a curved deformation sometimes occurs to the ceramic plate 30 itself before the electrical conducting path and the multilayer interconnection board 32 are formed. Such a deformation of the probe board 18a caused by the deformation of the board member 30 is maintained even in a free state without exterior force acting on the probe board.

The probe assembly 18 according to the present invention has the tips of all the probes 18b previously uniformed so as to be aligned on the same plane P1 despite the deformation of the probe board 18a in a free state with the deformation as shown in FIG. 2 retained. It is desirable that this plane P1 be parallel to an imaginary plane P of the flat ceramic plate to be obtained when no deformation is caused on the ceramic plate 30 as the board member.

The probe assembly 18 having the probes 18b with their tips thus uniformed is supported on the support member 12 through a plurality of bolts 42 in a state that the deformation on the probe board 18a is retained.

For the support by the bolts 42, on the upside of the ceramic plate 30, that is, on the upside of the probe board 18a is formed an anchor portion 50 with a female threaded hole 48 for receiving the front end portion of each bolt 42.

The top surfaces of the respective anchor portions 50 are flat and uniformed so as to coincide with the same plane P2 parallel to the imaginary plane P in a free state retaining the aforementioned curved deformation on the probe board 18a. Thus, the height dimensions of the anchor portions 50 are different according to the height positions of the portions where the respective anchor portions 50 of the probe board 18a with the deformation are provided.

In order to keep the distance between the flat top surface of the anchor portion 50 and the flat mounting reference plane 12a of the support member 12 properly, a plurality of cylindrical spacers 52 having the same height dimension are used. Also, a through hole 54 for receiving a spacer 52 is formed on the wiring board 14 in correspondence to each anchor portion 50 in the thickness direction of the wiring board 14 to penetrate the wiring board 14. Further, a through hole 56 adapted to the through hole 54 is formed in a pogo pin block 16a.

Each bolt 42 is disposed with its head portion 42a located on the side of the support member 12 to penetrate the spacer 52, the front end portion of its shaft portion 42b being screwed into the female threaded hole 48 of the corresponding anchor portion 50.

In the example shown in FIG. 2, the spacer and a cylindrical or annular washer 58 is applied to the top surface of the anchor portion 50 which receives the lower end of the spacer. Consequently, in this case, the length dimension of the spacer 52 is set at a value obtained by subtracting the height of the washer 58 from a preset distance dimension between the mounting surface 12a of the support member 12 and the top surface of the anchor portion 50.

Figure 3:
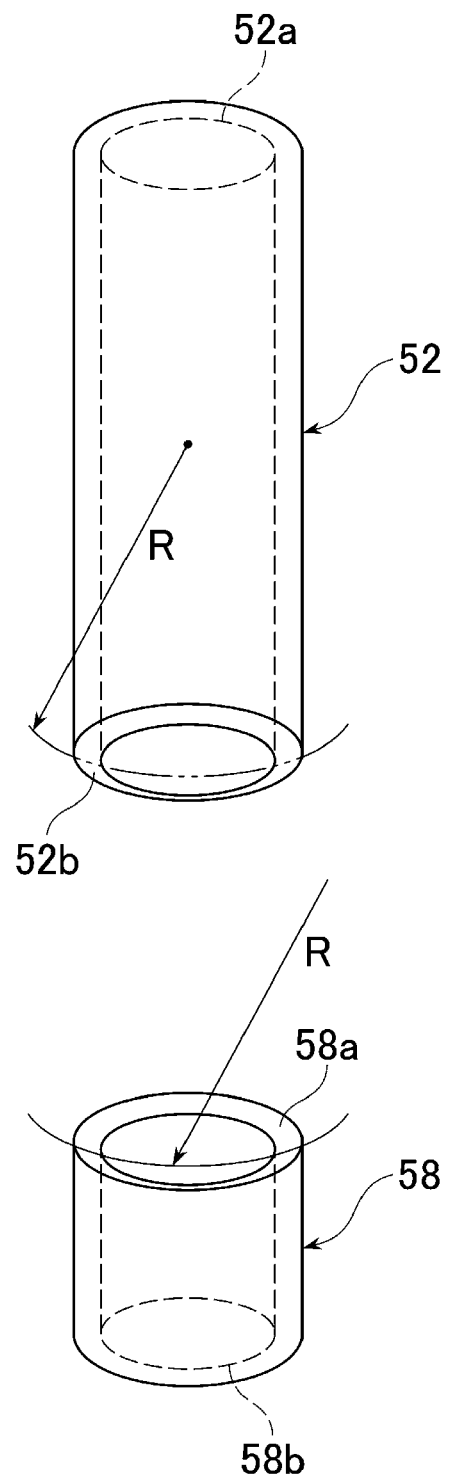
FIG. 3 is a perspective view showing the spacer and the washer shown in FIG. 1.

The upper end face 52a of the spacer 52 is formed, as shown in FIG. 3, on a flat plane orthogonal to the axis of the spacer 52 in correspondence to the flat mounting reference plane 12a of the support member 12. On the other hand, the lower end face 52b is a convex spherical curved plane along a spherical surface defined by a radius R with the gravity of, for example, the spacer 52 as the center.

Also, the upside 58a of the washer 58 for receiving the lower end face 52b of the spacer 52 is a convex spherical curved plane defined by the radius R that defined the convex spherical curved plane of the spacer 52. Consequently, the spacer 52 and the washer 58 are adapted to each other with the lower end face 52b and the upside 58a of the washer 58 mutually pivotally connected in a state that the axes coincide with each other. On the other hand, the underside 58b of the washer 58 opposing the flat top surface of the anchor portion 50 is a flat plane orthogonal to the central axis of the washer 58.

Figure 4:
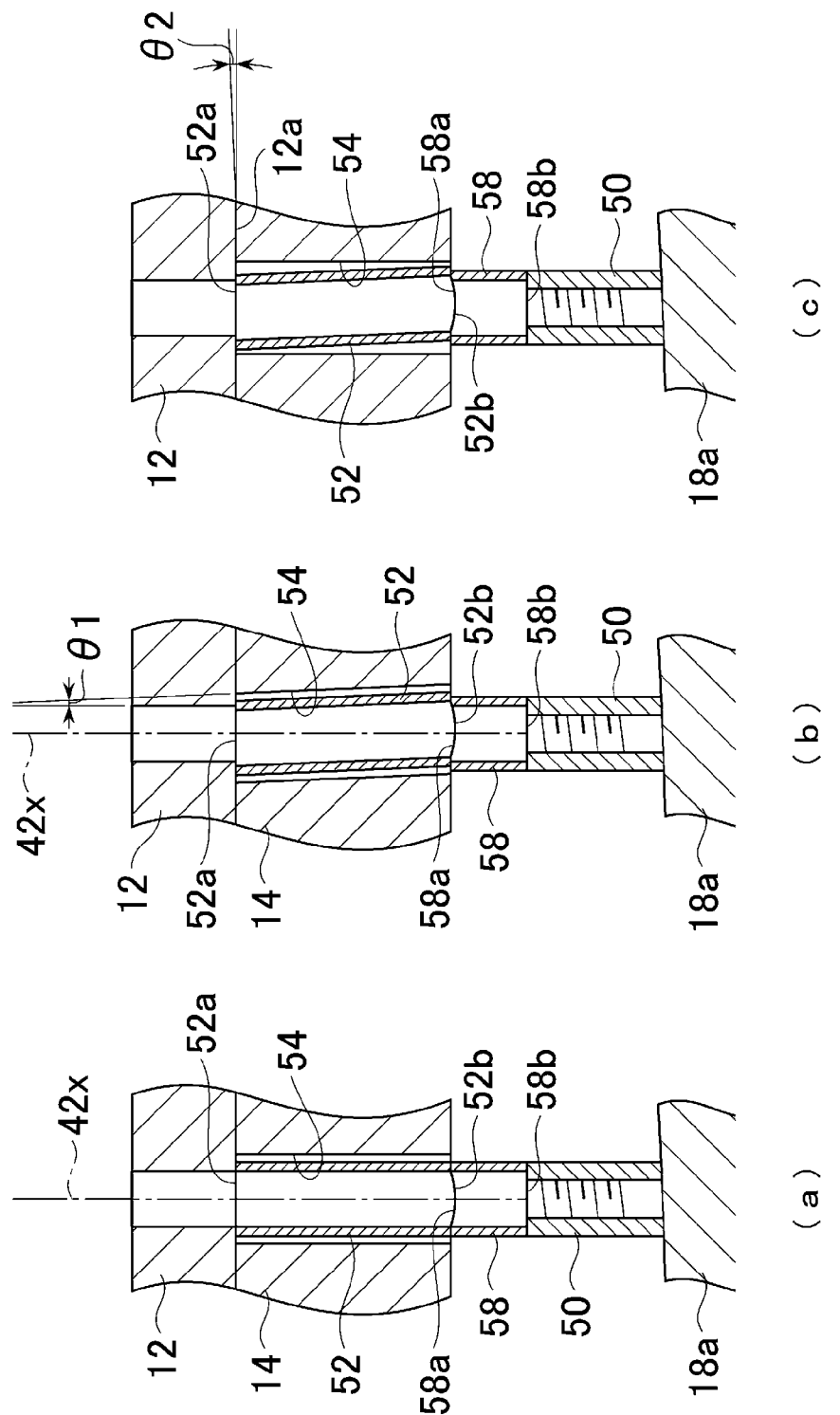
FIG. 4 is a sectional view showing a relationship in contact of the spacer and the washer shown in FIG. 1, in which (a) shows a state where the through hole to receive the spacer is not inclined nor the reference plane of the support member is inclined; (b) a state where the through hole to receive the spacer is inclined; and (c) a state where the reference plane of the support member is inclined.

Such a spacer 52 and washer 58 are disposed, as shown in FIGS. 4(a) and 4(b), such that the flat upper end face 52a of the spacer 52 is in contact with the mounting reference plane 12a of the support member 12, that the lower end face 58b of the washer 58 is in contact with the flat top surface of the anchor portion 50, and that the convex spherical curved plane 52b and the concave spherical curved plane 58a are fitted to each other, and in order to retain the foregoing curved deformation of the probe board 18a, are tightened between the support member 12 and the probe board 18a by the bolt 42 (see FIG. 2) penetrating each of them.

At this time, as shown in FIG. 4(a), there is no deflection or distortion in the support member 12, the mounting surface 12a of which is retained at right angles to the axis 42x of the bolt 42, and in case where no inclination due to a production error is caused in the through hole 54, the spacer 52 and the washer 58 are tightened by the bolt 42 in an aligned state so that their axes may coincide. Also, as mentioned above, the flat upper end face 52a of the spacer 52 is uniformly brought into contact with the flat mounting surface 12a of the support member 12, and the flat lower end face 58b of the washer 58 are joined with the flat top surface of the anchor portion 50. Further, the spacer 52 and the washer 58 are joined with each other at their respective convex spherical curved plane 52b and the concave spherical curved plane 58a.

Thus, the spacer 52 is retained stably between the support member 12 and the probe board 18a together with the washer 58, and, as a result, the probe board 18a is surely supported on the support member 12 with the deformation retained, so that the tips of the respective probes 18b are surely retained on the same plane P1 (see FIG. 2).

FIG. 4(b) shows an example in which the axis of the through hole 54 for receiving the spacer 52 has an inclination at angle $\theta 1$ to the axis $42x$ of the bolt 42 due to a production error. In this case, the axis of the spacer 52 is inclined at the angle $\theta 1$ to the axis $42x$ of the bolt 42, so that the stability between the upper end face 52a of the spacer 52 and the mounting surface 12a of the support member 12 is lowered slightly.

However, since the lower end face 52b of the spacer 52 is surely caught on the corresponding upside 58a of the washer 58, the spacer is not loosened by vibration such as heretofore, and the spacer 52 as well as the washer 58 retains the space between the support 12 and the probe board 18a properly so as to retain the deformation of the probe board 18a. By this, the tips of the respective probes 18b are surely held on the same plane as in the case of FIG. 4(a).

FIG. 4(c) shows an example where deflection or distortion is caused in the support member 12, resulting in inclination of the mounting surface 12a at an angle $\theta 2$. In this case, the spacer 52 becomes inclined at the angle $\theta 2$ such that the upper end face 52a of the spacer 52 is along the inclined mounting surface 12a, but since, as explained according to FIG. 4(b), the lower end face 52b of the spacer 52 is surely received by the corresponding upside 58a of the washer 58, no loosening occurs as heretofore by vibration, and the spacer as well as the washer 58 properly retain the space between the support member 12 and the probe board 18a so as to retain the deformation of the probe board 18a. Thus, the tip of each probe 18b is surely retained on the same plane like the example shown in FIG. 4(a).

In the foregoing, an example is shown wherein the lower end face 52b of the spacer 52 is a convex spherical surface and the upper end face 58a of the washer 58 receiving the lower end face is a concave spherical surface corresponding to the convex shape. In place of this, as shown in FIG. 5, it is possible to from the lower end face 52b of the spacer 52 as a concave spherical surface and the upper end face 58a of the washer 58 receiving the lower end face as a convex spherical surface to correspond thereto.

Figure 5:
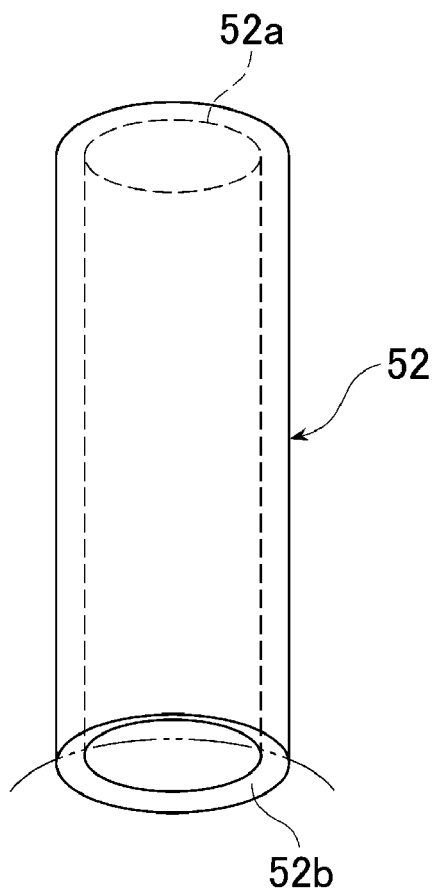
FIG. 5 is a view similar to FIG. 3 showing another embodiment according to the present invention.
Figure 5:
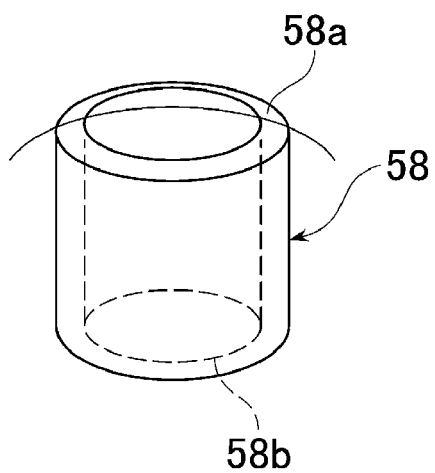
Figure 6:
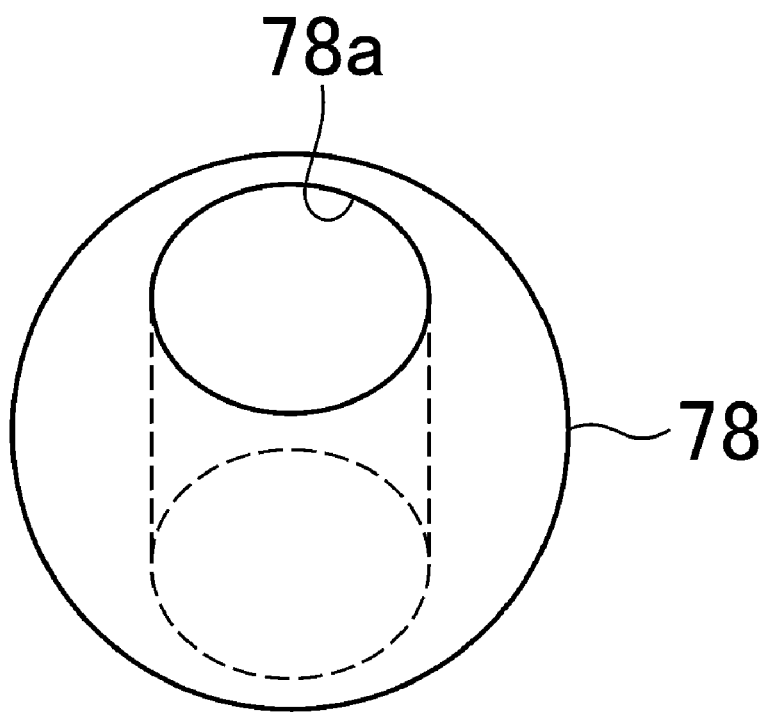
FIG. 6 is a perspective view of the spherical body washer showing another embodiment according to the present invention.

Also, in place of the cylindrical or annular washer 58 shown in FIG. 5, it is possible to use a washer made of a spherical body 78 in which is formed a through hole 78a to receive the bolt 42 in the diametrical direction, as shown in FIG. 6. Since the spherical washer 78, as mentioned above, receives at its upper end the concave spherical surface 52b which is the lower end face of the spacer 52 and abuts the top surface of the anchor portion 50 at the entire circumference of the lower end, the looseness of the spacer 52 due to vibration as heretofore, as mentioned above, can be surely prevented. Therefore, as in case of the foregoing example, by retaining the distance between the support member 12 and the probe board 18a adequately, the tips of the respective probes 18b can be surely retained on the same plane.

Figure 7:
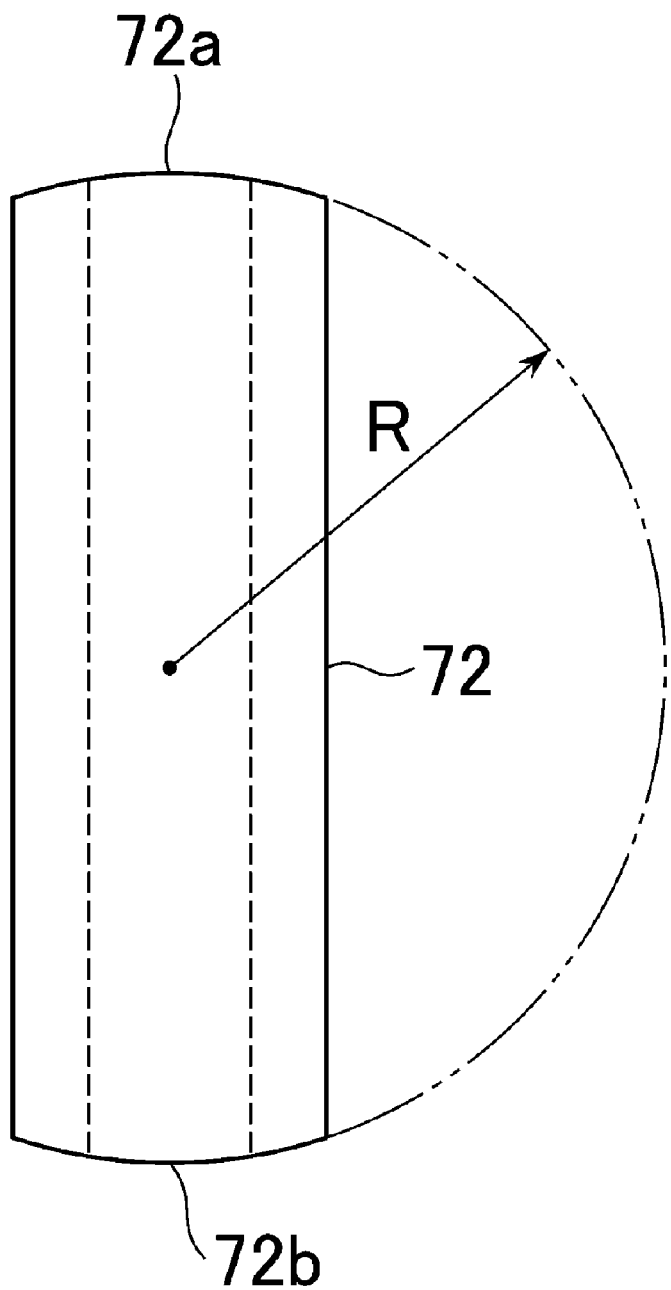
FIG. 7 is a front elevation of a spacer further showing a still another embodiment of the present invention.
Figure 8:
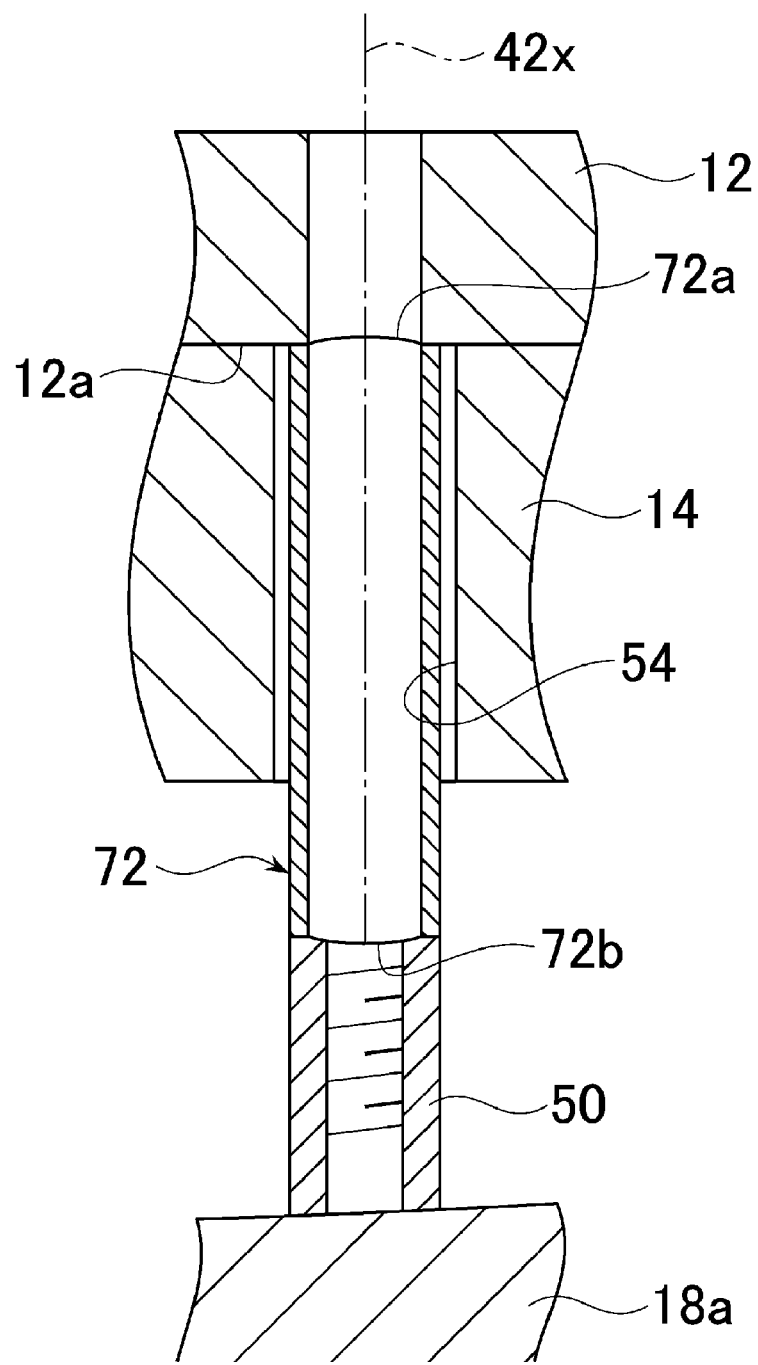
FIG. 8 is a partially enlarged sectional view of the electrical connecting apparatus according to the present invention into which the spacer shown in FIG. 7 is assembled.
Figure 9:
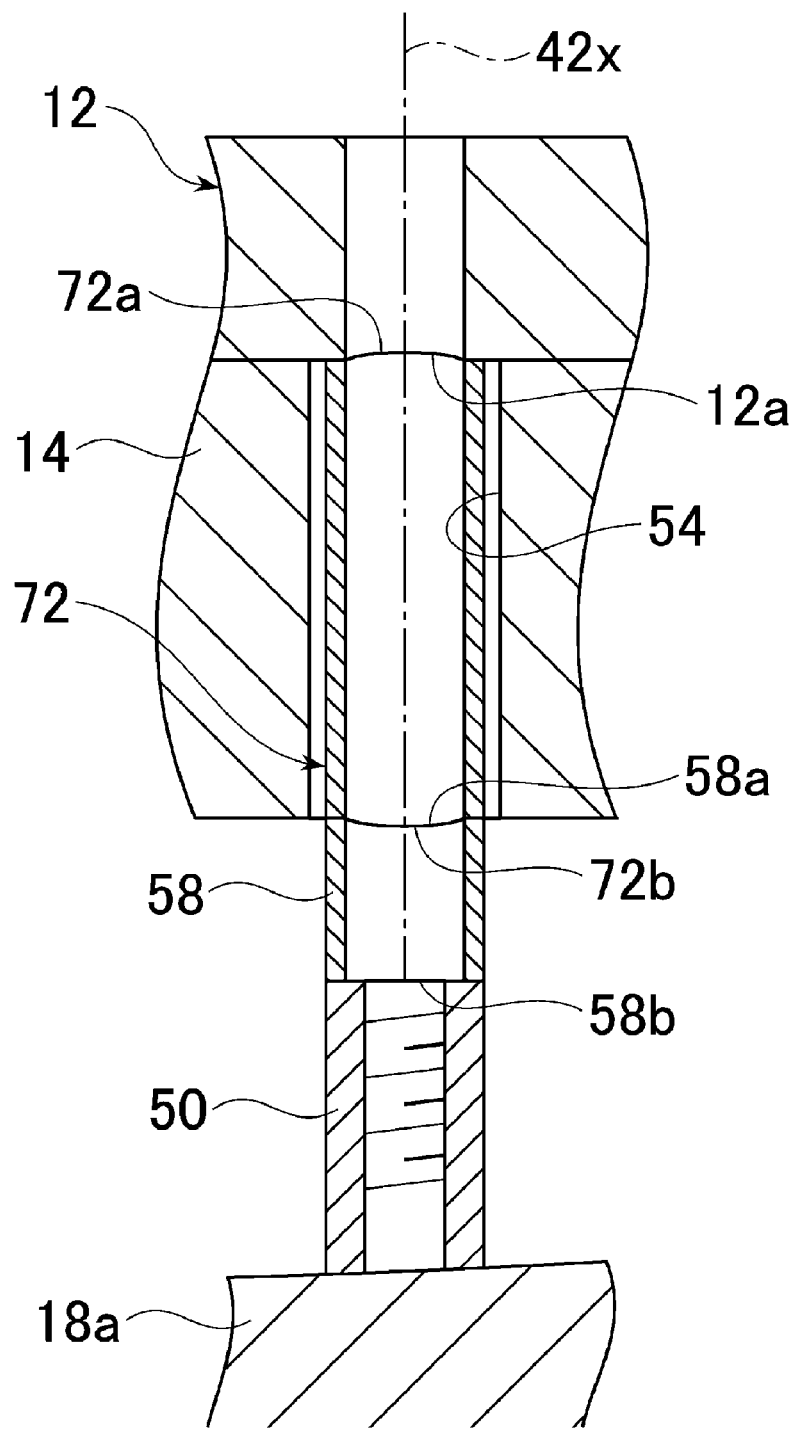
FIG. 9 is a view similar to FIG. 8 into which the spacer shown in FIG. 7 is assembled together with the washer.

FIG. 7 shows an example of a spacer 72 in which both ends of the upper end face 72a and the lower end face 72b are formed on the convex spherical surface. As shown in FIG. 8, this spacer 72 is disposed without using a washer, by bringing the upper end face 72a, i.e., the convex spherical surface, with the top surface of the anchor portion 50.

According to this spacer 72, since both its ends are convex spherical surfaces, it is possible to bring the respective end faces of the slightly inclined spacer 72 into contact at its entire circumference with the mounting surface 12a of the corresponding support member 12 or with the top surface of the anchor portion 50, without using the washer 58 having the spherical curved surface, even if the mounting surface 12a is inclined or even if the through hole 54 is inclined by a production error. Since this enables to surely prevent loosening of the spacer 52 by a simple constitution, the distance between the support member 12 and the probe board 18a can be retained adequately as in the forgoing example, and the tips of the respective probes 18b can be surely retained on the same plane.

Also, as shown in FIG. 8, the spacer 72 whose both ends are convex spherical surfaces can be used in combination with the washer 58 whose upside 58a is a concave curved surface.

Further, in the forgoing is shown an example that the end face of the spacer 72 is formed as a convex curved surface, but it is possible, in place of this, to make both end faces of the spacer 72 flat planes parallel to the axis or concave spherical surfaces, and to form the mounting surface 12a of the support member 12 receiving the flat plane or the top surface of the anchor portion 50 as a convex spherical surface, and to adopt various combinations with the washers 58, 79.

INDUSTRIAL APPLICABILITY

The spacer according to the present invention can be applied to an electrical connecting apparatus having an adjusting mechanism for correcting a curved deformation of the probe board.

What is claimed is:

1. An electrical connecting apparatus for connecting a tester and an electric connection terminal of a device under test to undergo an electrical inspection by the tester, comprising:
   a support member having a mounting reference surface;
   a wiring board having a wiring circuit to be connected to the tester, being disposed with one surface opposed to the reference surface of the support member and having a plurality of through holes penetrating in the thickness direction;
   a flat plate-like probe board having on one surface a plurality of probes capable of bringing their tip portions into contact with the connection terminal of the device under test and a plurality of threaded holes formed in correspondence to the through holes of the wiring board on the other surface, and the other surface is disposed to oppose the other surface of the wiring board;
   an electric connector disposed between the probe board and the wiring board for electrically connecting the probes to a portion of the wiring circuit;
   screw members whose front ends penetrate at least the through holes of the wiring board respectively so as to connect the probe board with the support member; and
   a plurality of cylindrical spacers disposed to penetrate at least the wiring board between the other surface of the probe board and the reference surface of the support member, the spacers being disposed to penetrate at least the wiring board and being penetrated by the respective screw members;
   wherein at least one end face of the spacer, the support member to receive the end face or the contact surface of the probe board is a spherical curved surface.

2. The electrical connecting apparatus claimed in claim 1, wherein curved deformation is caused in the probe board in an unloaded free state, wherein the probes have their tips located on the same plane in a state that the probe board retains the deformation; and
   wherein the spacers act to hold the tips of the probes on the same plane by retaining the deformation of the probe board.

3. The electrical connecting apparatus claimed in claim 2, wherein a plurality of anchor portions each having the threaded hole to receive the front end of each screw member are formed on the other surface of the probe board, and wherein the top surface of the anchor portion is a flat plane located on the same plane with the deformation of the probe board retained.

4. The electrical connecting apparatus claimed in claim 3, wherein an end face to abut the top surface of the anchor portion of the spacer is a convex spherical curved surface.

5. The electrical connecting apparatus claimed in claim 3, wherein the end face to abut a reference surface of the support member of the spacer is a convex spherical curved surface.

6. The electrical connecting apparatus claimed in claim 3, wherein in the spacer both the end face to abut the top surface of the anchor portion and the end face to abut the reference surface of the support member are convex spherical surfaces.

7. The electrical connecting apparatus claimed in claim 3, wherein a washer permitting the screw member to penetrate is disposed between the spacer and the top surface of the anchor portion for receiving the one end face of the spacer, wherein the one surface opposing the top surface of the anchor portion of the washer is a flat plane, and wherein the other surface for receiving the end face of the spacer is a spherical curved surface.

8. The electrical connecting apparatus claimed in claim 7, wherein the one end face of the spacer is a convex spherical surface, and wherein the other surface of the washer for receiving the one end face is a concave spherical surface.

9. The electrical connecting apparatus claimed in claim 8, wherein the end face of the spacer opposing the reference surface of the support member is a flat plane.

10. The electrical connecting apparatus claimed in claim 8, wherein the end face of the spacer opposing the reference surface of the support member is a convex spherical surface.

11. The electrical connecting apparatus claimed in claim 3, wherein a washer permitting the screw member to penetrate is disposed between the spacer and the top surface of the anchor portion to receive one end face of the spacer, and wherein the washer is made of a spherical body in which a through hole permitting the screw member to penetrate is formed in the diametrical direction.

12. The electrical connecting apparatus claimed in claim 2, wherein the probe board is provided with a ceramic plate and a multilayer interconnection board formed on one surface of the ceramic plate, wherein on the surface of the multilayer interconnection board a plurality of probe lands for the probes are formed to project in a direction to be away from the ceramic plate, wherein each probe extends from the end face of each probe land, and wherein on the end face of the probe land the end faces of the probe lands are located on the same plane with the deformation of the probe board retained.

* * * * *